(12) United States Patent
Cho et al.

(10) Patent No.: US 10,930,715 B2
(45) Date of Patent: Feb. 23, 2021

(54) FLEXIBLE DISPLAY DEVICE AND METHOD FOR MANUFACTURING THE DEVICE

(71) Applicant: LG Display Co., Ltd., Seoul (KR)

(72) Inventors: Hangsup Cho, Paju-si (KR); Seongeun Park, Paju-si (KR); Woosup Shin, Paju-si (KR); Hyeonwoo Lee, Paju-si (KR); Bongchul Kim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 11 days.

(21) Appl. No.: 16/146,126

(22) Filed: Sep. 28, 2018

(65) Prior Publication Data
US 2019/0103448 A1  Apr. 4, 2019

(30) Foreign Application Priority Data

Sep. 29, 2017  (KR) ......................... 10-2017-0127711

(51) Int. Cl.
*H01L 27/32* (2006.01)
*G06F 1/16* (2006.01)
(Continued)

(52) U.S. Cl.
CPC ........ *H01L 27/3244* (2013.01); *G06F 1/1652* (2013.01); *H01L 27/3232* (2013.01);
(Continued)

(58) Field of Classification Search
CPC ............. H01L 27/3244; H01L 27/3232; H01L 51/0097; H01L 2251/5338; G06F 1/1652; G06F 2203/04102; G06F 2203/04103
See application file for complete search history.

(56) References Cited

U.S. PATENT DOCUMENTS 9,019,696 B2    4/2015 Hamers et al.
2006/0163565 A1  7/2006 Park et al.
(Continued)

FOREIGN PATENT DOCUMENTS

JP    2003-280548 A    10/2003
JP    2008-046565 A    2/2008
(Continued)

OTHER PUBLICATIONS

Extended European Search Report dated Feb. 18, 2019, in corresponding European Patent Application No. 18196659.9.
(Continued)

*Primary Examiner* — Thanh Y. Tran
(74) *Attorney, Agent, or Firm* — Morgan, Lewis & Bockius LLP

(57) ABSTRACT

A flexible display device and a method for manufacturing a flexible display device are provided. A flexible display device includes: a support substrate having a first thickness and including a first material, the support substrate further including first and second main faces opposite to each other, a buffer substrate on the first main face of the support substrate, the buffer substrate having a second thickness smaller than the first thickness, and the buffer substrate including a second material more flexible than the first material, a thin-film transistor array on the buffer substrate, such that the buffer substrate is between the thin-film transistor array and the support substrate, and a sealing substrate fixed above the thin-film transistor array, the thin-film transistor array being between the buffer substrate and the sealing substrate.

9 Claims, 16 Drawing Sheets

(51) Int. Cl.
*H01L 51/00* (2006.01)
*H01L 51/56* (2006.01)
*H01L 51/52* (2006.01)

(52) U.S. Cl.
CPC .......... *H01L 51/0097* (2013.01); *H01L 51/56* (2013.01); *G06F 2203/04102* (2013.01); *G06F 2203/04103* (2013.01); *H01L 51/5237* (2013.01); *H01L 2251/5338* (2013.01)

(56) References Cited

U.S. PATENT DOCUMENTS

| | | |
|---|---|---|
| 2008/0042940 A1 | 2/2008 | Hasegawa |
| 2008/0212271 A1 | 9/2008 | Misawa |
| 2009/0278449 A1 | 11/2009 | Choi et al. |
| 2010/0308335 A1 | 12/2010 | Kim et al. |
| 2011/0140995 A1 | 6/2011 | Hamers et al. |
| 2012/0212433 A1 | 8/2012 | Lee et al. |
| 2013/0169515 A1 | 7/2013 | Prushinskiy et al. |
| 2015/0255740 A1 | 9/2015 | Nakada et al. |
| 2016/0179229 A1* | 6/2016 | Ahn ...................... H01L 27/323 345/173 |
| 2017/0069692 A1* | 3/2017 | Lee ........................ G06F 3/044 |
| 2017/0092897 A1 | 3/2017 | Liu |
| 2017/0320803 A1 | 11/2017 | Richter et al. |
| 2019/0025945 A1 | 1/2019 | Lindblad |

FOREIGN PATENT DOCUMENTS

| | | |
|---|---|---|
| JP | 2008-157996 A | 7/2008 |
| JP | 2011-008937 A | 1/2011 |
| JP | 2011-522299 A | 7/2011 |
| JP | 2013-254747 A | 12/2013 |
| JP | 2015-180930 A | 10/2015 |
| JP | 2015-228022 A | 12/2015 |
| JP | 2016-110114 A | 6/2016 |
| WO | 2008/020566 A1 | 2/2008 |

OTHER PUBLICATIONS

Office Action dated Aug. 8, 2019, in corresponding Japanese Patent Application No. 2018-184044.

Office Action dated Nov. 4, 2020, in corresponding Japanese Patent Application No. 2018-184044.

* cited by examiner

FLEXIBLE DISPLAY DEVICE AND METHOD FOR MANUFACTURING THE DEVICE

CROSS-REFERENCE TO RELATED APPLICATION(S)

This application claims the benefit of and priority to Korean Patent Application No. 10-2017-0127711, filed on Sep. 29, 2017, the entirety of which is hereby incorporated by reference.

BACKGROUND

1. Technical Field

The present disclosure relates to a flexible display device and a method for manufacturing the device. More particularly, the present disclosure relates to a rollable display device that is switchable between rolled and extended states, and a method for fabricating the device.

2. Discussion of the Related Art

A display device applies to a variety of electronic devices, such as televisions (TVs), mobile phones, notebook computers, and tablet computers. Therefore, studies are being continued to develop thinner, lighter, and lower-power-consuming display devices.

Some examples of the display device include a liquid crystal display device (LCD), a plasma display panel device (PDP), a field emission display device (FED), an electroluminescence display device (ELD), an electro-wetting display device (EWD), an organic light-emitting display device (OLED), etc. In such display devices, partly to prevent damage or breakage of built-in components and wiring therein, a display panel thereof is generally provided in a flat form, and is driven in the flat state. As a result, an application of the flat-type display device is limited.

To widen the application of the display device, a flexible display device having a flexible substrate made of flexible material has been proposed. By way of example, the flexible display device includes a bendable display device, a foldable display device, and a rollable display device.

However, in the related art flexible display device, a substrate is made of a flexible material, such as plastic, to allow flexibility. Such a flexible substrate made of the plastic may be vulnerable to external physical impact. In addition, to obtain the substrate made of the flexible material, a laser lift-off process may be performed on a carrier substrate for the flexible substrate. In this case, when the uniformity of the laser irradiation is lowered, there is a problem in that the substrate made of the soft material may peel off together with the carrier substrate.

SUMMARY

Accordingly, the present disclosure is directed to a flexible display device and a method for manufacturing the device that substantially obviate one or more of the issues due to limitations and disadvantages of the related art.

An aspect of the present disclosure is to provide a flexible display device in which damage due to external physical impact thereto is reduced, and to provide a method for manufacturing the device.

Another aspect of the present disclosure is to provide a flexible display device having a structure configured such that the device is produced without a laser lift-off process, and to provide a method for manufacturing the device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a flexible display device. including: a support substrate having a first thickness and including a first material, the support substrate further including first and second main faces opposite to each other, a buffer substrate on the first main face of the support substrate, the buffer substrate having a second thickness smaller than the first thickness, and the buffer substrate including a second material more flexible than the first material, a thin-film transistor array on the buffer substrate, such that the buffer substrate is between the thin-film transistor array and the support substrate, and a sealing substrate fixed above the thin-film transistor array, the thin-film transistor array being between the buffer substrate and the sealing substrate.

In another aspect, there is provided a method for manufacturing a flexible display device, the method including: providing a carrier substrate including a first material, the carrier substrate further including first and second main faces opposite to each other, providing a buffer substrate on a first main face of the carrier substrate, the buffer substrate including a second material more flexible than the first material, providing a thin-film transistor array on a buffer substrate, providing an organic light-emitting element array on the thin-film transistor array, the organic light-emitting element array including a plurality of organic light-emitting elements respectively corresponding to a plurality of sub-pixels, providing a sealing substrate on the organic light-emitting element array such that the thin-film transistor array and organic light-emitting element array are sealed between the buffer and sealing substrates, and etching and polishing a portion of the carrier substrate from the second main face thereof, to provide a remaining portion of the carrier substrate as a support substrate, wherein the support substrate has a first thickness.

Other systems, methods, features and advantages will be, or will become, apparent to one with skill in the art upon examination of the following drawings and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification.

Figure 1:
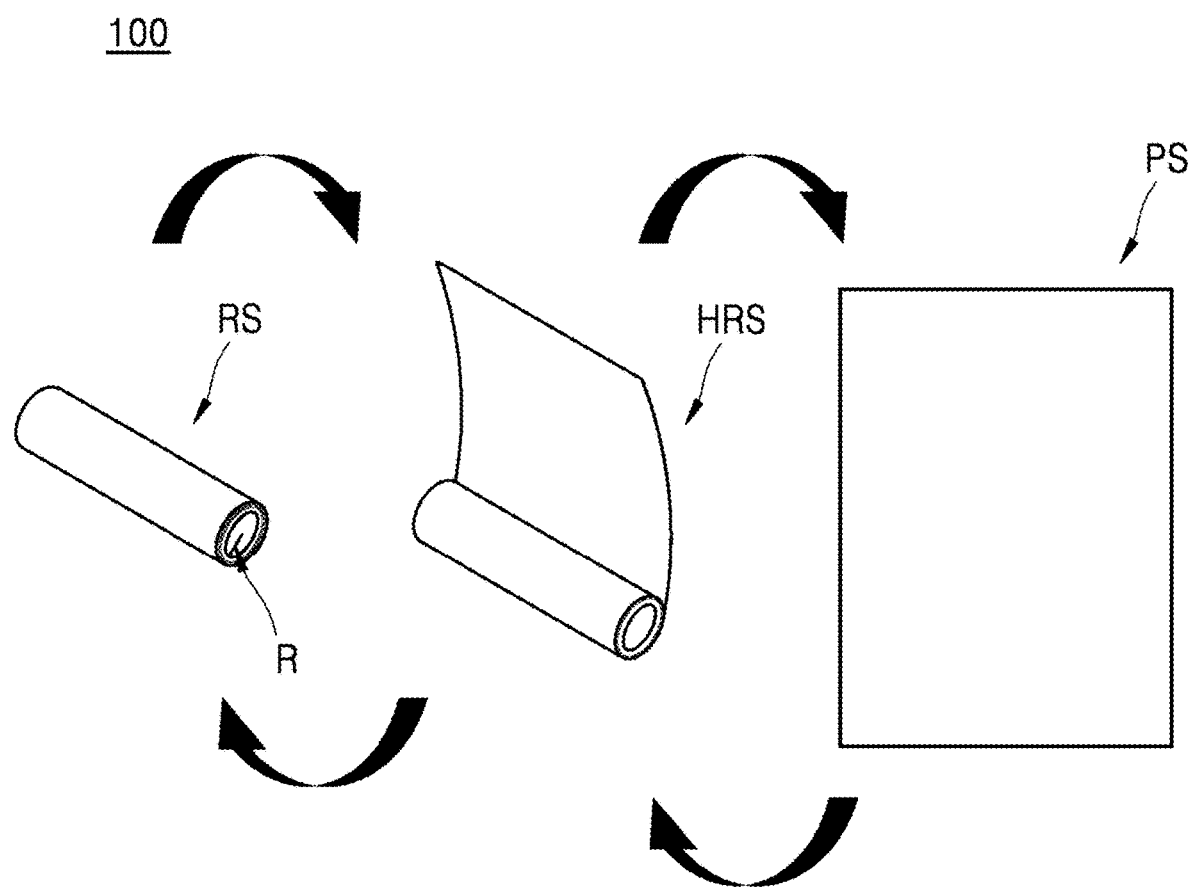
FIG. 1 shows an extended state, a partially-rolled state, and a fully-rolled state of a flexible display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof may be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, a flexible display device according to an embodiment of the present disclosure will be described in detail with reference to the accompanying drawings.

FIG. 1 shows an extended state, a partially-rolled state, and a fully-rolled state of a flexible display device according to an embodiment of the present disclosure.

As illustrated in the FIG. 1 example, a flexible display device 100 may include a rollable display device that is switchable among an extended from (PS; Plane-Shaped), various degrees of a partially-rolled form, e.g., a half-rolled form (HRS; Half Rolled-Shaped), and a fully-rolled form (Rolled-Shaped; RS). When the device has the partially-rolled form (e.g., HRS; Half Rolled-Shaped), and the fully-rolled form (Rolled-Shaped; RS), the flexible display device 100 may be bent at a particular radius of curvature R. As such, the flexible display device 100 may be implemented with a structure including a substrate made of a flexible material.

Figure 2:
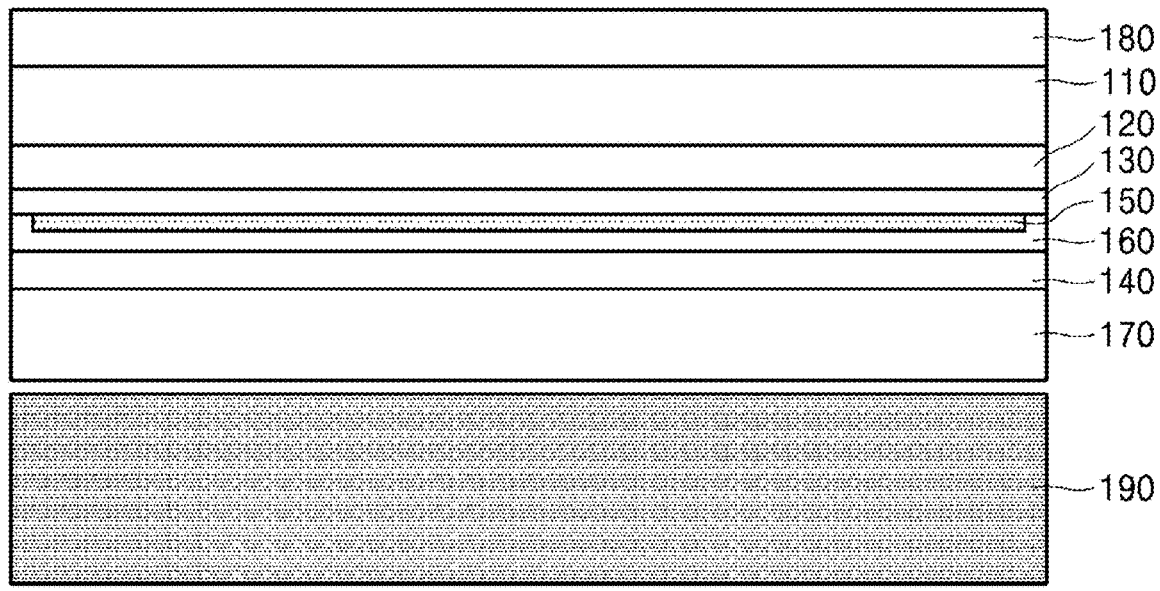
FIG. 2 is a cross-sectional view of a flexible display device according to an embodiment of the present disclosure.
Figure 3:
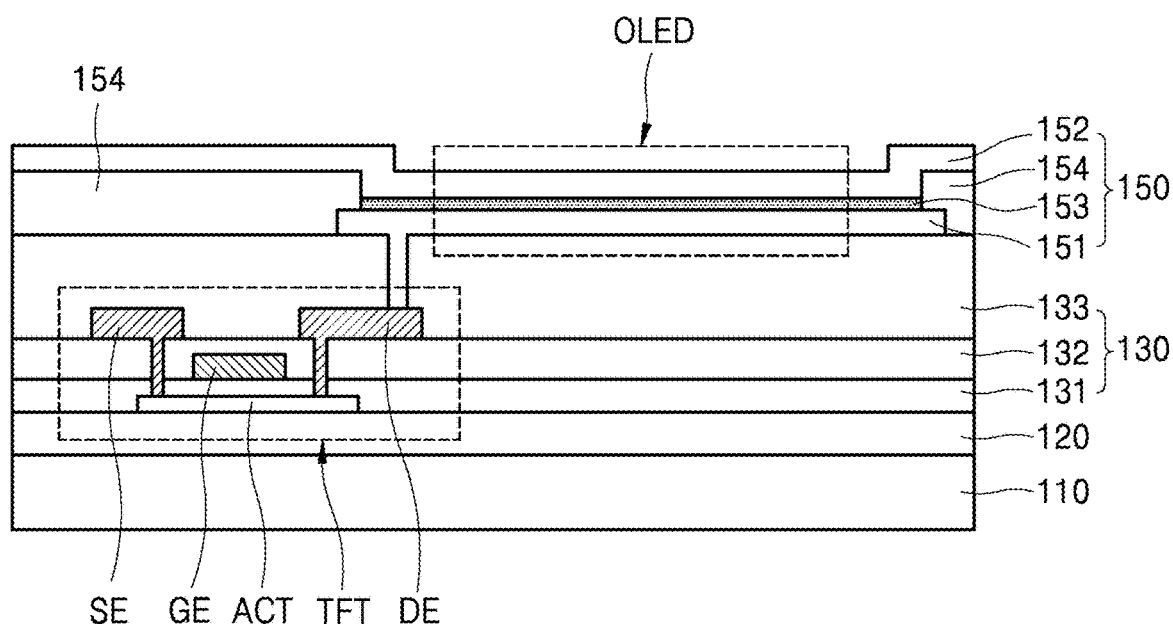
FIG. 3 shows an example of a cross section of a thin-film transistor array and an organic light-emitting element array of FIG. 2.
Figure 4:
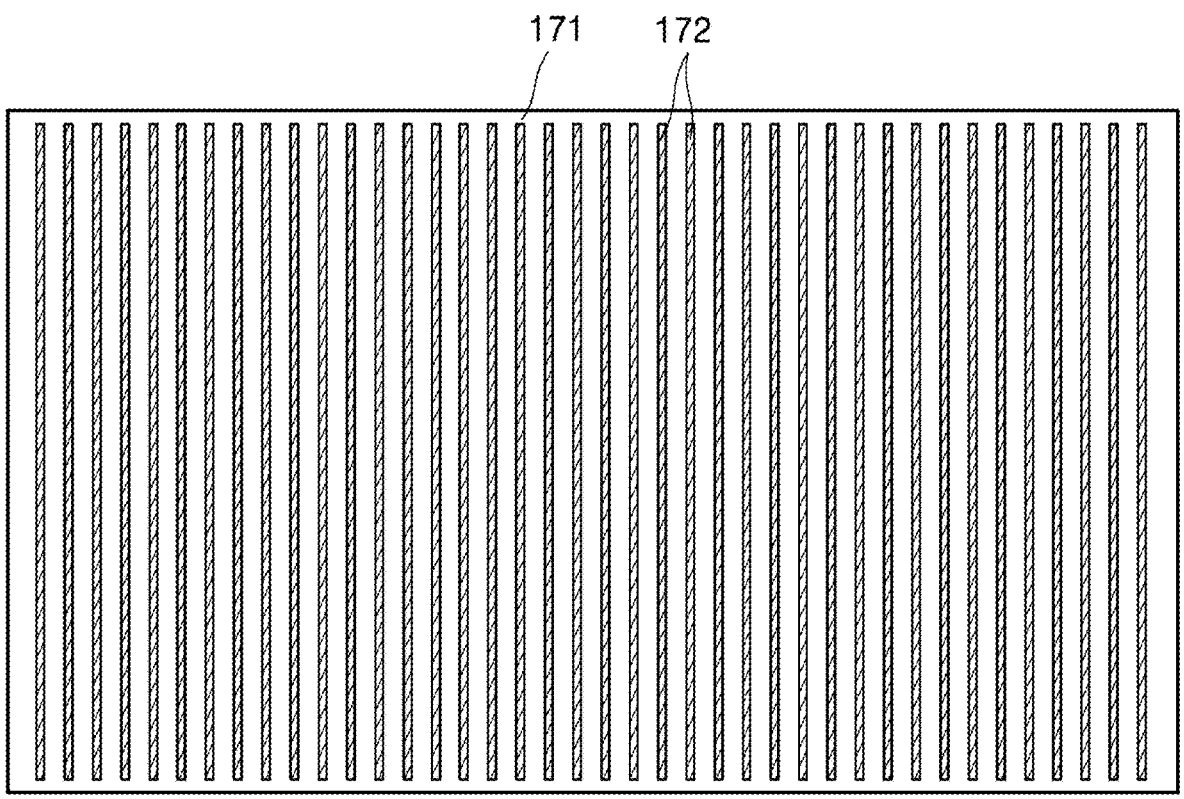
FIG. 4 is a top view of an example of a rolling-assisting film of FIG. 2.

FIG. 2 is a cross-sectional view of a flexible display device according to an embodiment of the present disclosure. FIG. 3 shows an example of a cross section of a thin-film transistor array and an organic light-emitting element array of FIG. 2. FIG. 4 is a top view of an example of a rolling-assisting film of FIG. 2.

As illustrated in the example of FIG. 2, a flexible display device 100 may include a support substrate 110, a buffer substrate 120 on one face of the support substrate 110, a thin-film transistor array 130 on the buffer substrate 120, and a sealing substrate 140 above the thin-film transistor array 130. The thin-film transistor array 130 may be between the buffer substrate and the sealing substrate, and may thus be sealed by the sealing substrate.

Further, the flexible display device 100 may further include an organic light-emitting element array 150 between the thin-film transistor array 130 and the sealing substrate 140, an adhesive film 160 for fixing the sealing substrate 140 on the organic light-emitting element array 150, with the adhesive film on one face of the sealing substrate, a rolling-assisting film 170 on the other face of the sealing substrate 140, and a polarization film 180 on the other face of the support substrate 110. The flexible display device 100 may further include a bottom cover 190 corresponding to the extended state (e.g., PS in FIG. 1) thereof.

The support substrate 110 may have a first thickness, and may be made of a first material. The first material may be a material that may transmit light and may have low reactivity to processes, such as etching and heat-treatment of semiconductor materials and metal materials. In addition, the first material may be a material having a softness at a thickness below a threshold value, while having a rigidity at a thickness exceeding the threshold value, such that deformation thereof may not occur due to a weight thereof. Further, the first material may be a material that may be subjected to an etching process and a polishing process, e.g., to reduce the thickness thereof. By way of example, the first material may be a glass, although embodiments are not limited thereto.

The first thickness of the support substrate 110 may be selected in consideration of a softness of the first material, a damage resulting from a particular physical impact thereto, and a rigidity to maintain a shape and posture. By way of example, the first thickness may be between about 50 µm and 100 µm, inclusive. In particular, the first thickness may be about Embodiments are not limited to these examples.

The buffer substrate 120 may have a second thickness smaller than the first thickness, and may be made of a second material that is softer than the first material. By way of example, the second material may include one or more of: polyethylene terephthalate (PET), ethylene naphthalate (PEN), polyimide (PI), polymethyl methacrylate (PMMA), polycarbonate (PC), polystyrene, and/or polyethersulfone (PES). For example, the second material may be PI with relatively high availability.

The second thickness of the buffer substrate 120 may be selected to reduce or prevent the buffer substrate 120 from being lifted up, and to suppress the transmittance degradation and the crack transmission through the buffer substrate 120. By way of example, if the second material is a PI, the second thickness may be in a range of about 3 to 20 µm, inclusive. Embodiments are not limited to these examples.

That is, when the thickness of the buffer substrate 120 is smaller than about cracks in the thin-film transistor array 130 may be more easily transferred to the support substrate 110, and/or the cracks in the support substrate 110 may be more easily transferred to the thin-film transistor array 130 and the organic light-emitting element array 150.

On the other hand, if the thickness of the buffer substrate 120 is greater than about 20 µm, bending stress may cause the buffer substrate 120 to be more easily separated from or lifted up from the support substrate 110 or the thin-film transistor array 130 in the rolled state (e.g., RS or HRS in FIG. 1). Further, the light transmittance of the device may be lowered due to the buffer substrate 120 having a thickness of greater than about 20 µm.

The flexible display device 100 may include both the support substrate 110 having the first thickness and made of the first material, and the buffer substrate 120 having the second thickness and made of the second material. As a result, a particular radius of curvature (e.g., R in FIG. 1) may be achieved in the rolled state (e.g., RS or HRS in FIG. 1) thereof. By way of example, when the flexible display device 100 is in the rolled state (e.g., RS or HRS in FIG. 1), the radius of curvature (e.g., R in FIG. 1) may be between about 40 mm and 3500 mm, inclusive. Embodiments are not limited to these examples.

In addition, when the device includes both the support substrate 110 and the buffer substrate 120, the rigidity of the device against external physical impact may be improved. Further, cracks resulting from the external physical impact or bending stress may be reduced or prevented from being transmitted in the vertical direction. Thus, the life and reliability of the flexible display device 100 may be improved. Further, embodiments of the present disclosure may reduce or prevent a dark spot defect resulting from the crack propagation, thereby reducing or preventing deterioration in image quality.

As illustrated in the FIG. 3 example, the thin-film transistor array 130 may define a plurality of pixel regions corresponding to a plurality of sub-pixels. The array 130 may include at least one thin-film transistor TFT respectively corresponding to each of a plurality of pixel regions. Further, the organic light-emitting element array 130 may include a plurality of organic light-emitting element OLEDs respectively corresponding to a plurality of sub-pixels.

By way of example, a thin-film transistor TFT in the thin-film transistor array 130 may include an active layer ACT on a buffer substrate 120, a gate electrode GE on a gate insulating film 131 covering an active layer ACT, and a source electrode SE and drain electrode DE on a first interlayer insulating film 132 covering the gate electrode GE. Further, the source electrode SE and the drain electrode DE may be covered with a second interlayer insulating film 133.

The gate electrode GE may be on a channel region of the active layer ACT. The source electrode SE may be connected to a source region of the active layer ACT, while the drain electrode DE may be connected to a drain region of the active layer ACT. When the thin-film transistor TFT is implemented as a driving element for supplying driving current to the organic light-emitting element OLED, either the source electrode SE or the drain electrode DE of the thin-film transistor TFT may be connected to the organic light-emitting element OLED.

The organic light-emitting element OLED may be on the second interlayer insulating film 133. The organic light-emitting element OLED may include a first electrode 151 and a second electrode 152 facing each other, and an organic light-emitting layer 153 between the first electrode 151 and the second electrode 152 facing each other. The organic light-emitting element array 150 may further include a bank layer 154 covering an edge of the first electrode 151.

With reference again to the example of FIG. 2, the polarization film 180 may be configured to polarize light emitted from the organic light-emitting element array 150 and transmitted through the buffer substrate 120 and the support substrate 110. The polarization film 180 may suppress deterioration in image quality resulting from the external light. By way of example, the polarization film 180 may have a thickness in a range of about 170 μm to 650 μm, although embodiments are not limited thereto.

The sealing substrate 140 may be fixed on the organic light-emitting element array 150 by the adhesive film 160 between the thin-film transistor array 130 and the sealing substrate 140. That is, while the buffer substrate 120 and the sealing substrate 140 may provide an outer part of a sandwich, for example, with the thin-film transistor array 130 and the organic light-emitting element array 150 between the two substrates, the buffer substrate 120 and the sealing substrate 140 that may be bonded to each other via the adhesive film 160.

The rolling-assisting film 170 may allow the flexible display device 100 to be formed into various degrees of a rolled form. By way of example, as illustrated in FIG. 4, the rolling-assisting film 170 may include at least one base 171 and a pattern of a plurality of ribs 172 on the base 171 and spaced apart by a particular distance. The ribs pattern 172 may be sandwiched between a pair of bases 171.

The arrangement direction of the ribs of the rib pattern 172 may correspond to the rolling direction of the flexible display device 100. As shown in the FIG. 4 example, when the device 100 is rolled along a long side of the flexible display device 100, an extending direction of each rib of the rib pattern may be parallel to a short side of the device, and the arrangement direction of the ribs of the pattern may be parallel to the long side. The ribs 172 may extend in a direction substantially perpendicular to the rolling direction.

As described above, the flexible display device 100 may include both the support substrate 110 made of a glass material, and a buffer substrate 120 made of a plastic material that is more flexible than the glass material. Thus, the rigidity of the device may be improved against external physical impact. Further, cracks resulting from the external physical impact or bending stress may be reduced or prevented from being transmitted in the vertical direction. Thus, the life and reliability of the flexible display device may be improved. Further, embodiments of the present disclosure may reduce or prevent a dark spot defect resulting from the crack propagation, thereby reducing or preventing deterioration in image quality.

Figure 5:
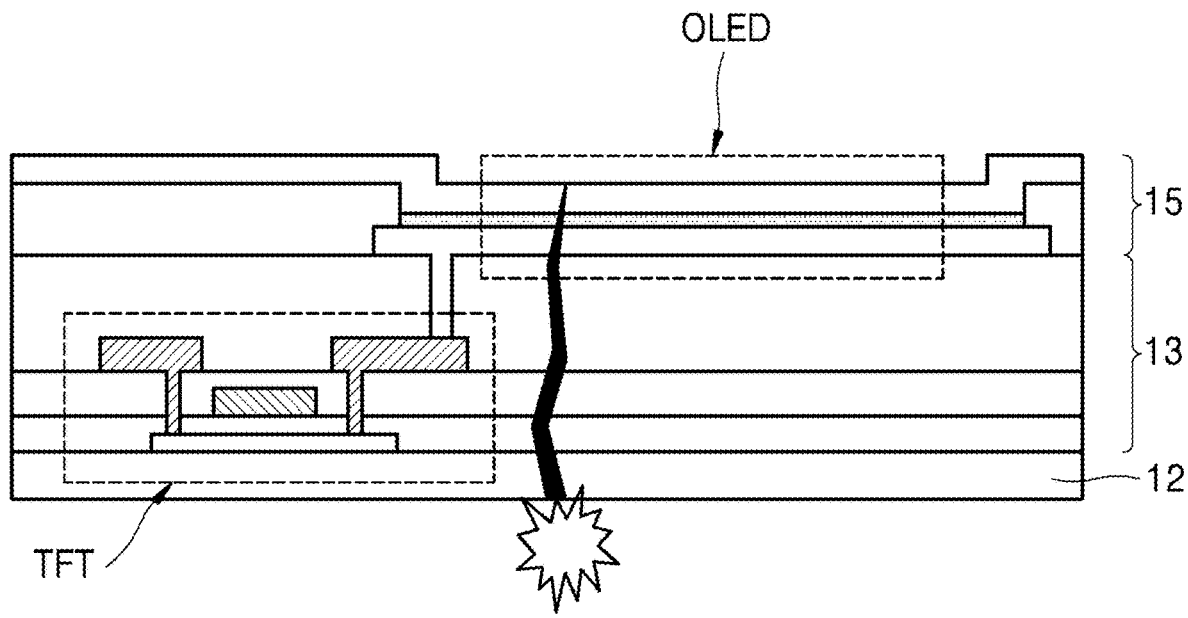
FIG. 5 shows defects that may occur in a first comparative example with a structure that does not include a buffer substrate, unlike the example in FIG. 2.
Figure 6:
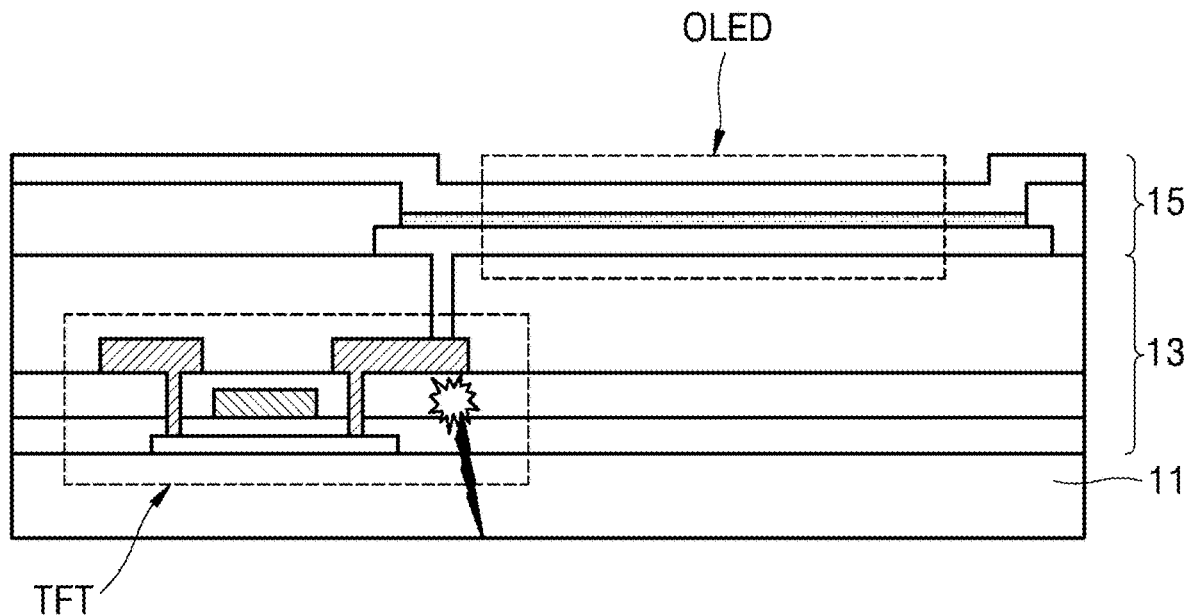
FIG. 6 shows a defect that may occur in a second comparative example with a structure that does not include a support substrate, unlike the example of FIG. 2.
Figure 7:
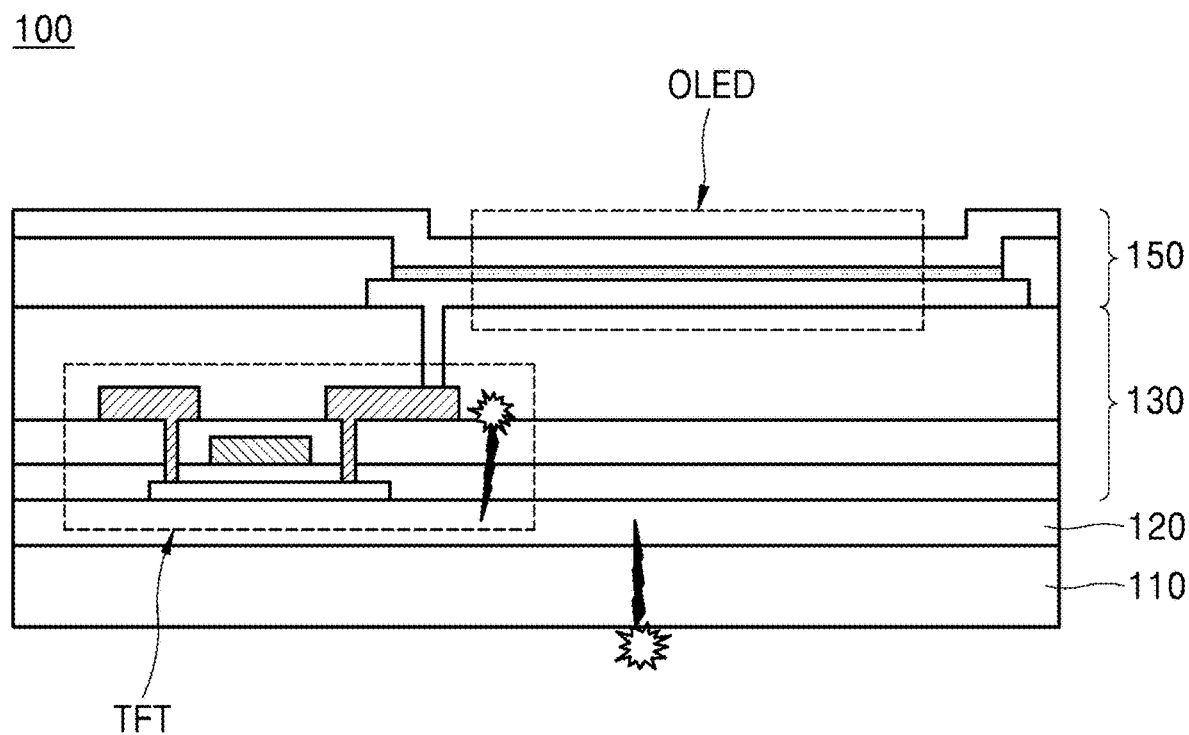
FIG. 7 shows how crack propagation may be inhibited in a flexible display device according to an embodiment of the present disclosure.

FIG. 5 shows defects that may occur in a first comparative example with a structure that does not include a buffer substrate, unlike the example in FIG. 2. FIG. 6 shows a defect that may occur in a second comparative example with a structure that does not include a support substrate, unlike the example of FIG. 2. FIG. 7 shows how crack propagation may be inhibited in a flexible display device according to an embodiment of the present disclosure.

As illustrated in the related art example of FIG. 5, the first comparative example REF1 includes only a buffer substrate 12 made of a plastic material, and excludes a support substrate made of a glass material. In this case, because the device of the first comparative example is susceptible or sensible to external physical impact, cracks resulting from the external physical impact may more easily occur in the thin-film transistor array 13 and the organic light-emitting element array 15. Particularly, the cracks resulting from the external physical impact may be more easily transmitted to the organic light-emitting element OLED. Thus, there is a problem in that the sub-pixel has a dark spot defect, which may result in deterioration in image quality or the device lifespan. In this first comparative example REF1, it has been experimentally confirmed that when a front-face striking strength is about 0.22 Joules (J) to 1.08 J, that is, when the average value of the front face striking strength is about 0.57 J, the crack occurs therein.

On the other hand, as illustrated in the related art example of FIG. 6, the second comparative example REF2 contains only the support substrate 11 of the glass material, excluding the buffer substrate of the plastic material. In this case, the device of the second comparative example may have a higher rigidity against the external physical impact than the first comparative example of FIG. 5. However, the device of the second comparative example has a problem in that the cracks occurring in one substrate due to the bending stress may be more easily transferred to another substrate. That is, when a crack occurs in the insulating films disposed in the thin-film transistor array 13 and the organic light-emitting element array 15 due to the bending stress in the rolled state of the device, the crack may be more easily transferred to the support substrate 11 of the glass material, so that the crack may be visually recognized from the outside. As a result, there is a problem in that deterioration of image quality, deterioration of aesthetic property, and deterioration of the device lifespan may occur. In this second comparative example REF2, it has been experimentally confirmed that when a front-face striking strength is about 0.05 J to 0.09 J, that is, when the average value of the front face striking strength is about 0.06 J, the crack occurs therein.

In contrast, as illustrated in the example of FIG. 7, the flexible display device 100 according to an embodiment of the present disclosure may include both the support substrate 110 of a glass material and the buffer substrate 120 of a plastic material. As a result, defects otherwise resulting from external physical impact and bending stress may be suppressed in embodiments of the present disclosure.

That is, because the buffer substrate 120 may mitigate the external physical impact to be transmitted therefrom to the thin-film transistor array 130 and the organic light-emitting element array 150, cracks due to external physical impacts, thus leading to the black spot defects, may be reduced. Further, cracks in the insulating film due to the bending stress may be reduced or prevented from transferring to the support substrate 110 of the glass material.

Further, in an embodiment of the present disclosure, it has been experimentally confirmed that when a front-face striking strength is about 0.61 J to 1.08 J, that is, when the average value of the front face striking strength is about 0.92 J, cracks may occur therein. In other words, the flexible display device 100 according to an embodiment of the present disclosure may maintain a normal state without the cracks occurring therein even when the device receives an impact strength greater that about 1.6 times to about 15.3 times than an impact strength applied to the first and second comparative examples as described above. As a result, the reliability and lifetime of the device may be improved.

To further reduce a bezel region in the flexible display device, various drive units may be on the support substrate 110.

Figure 8:
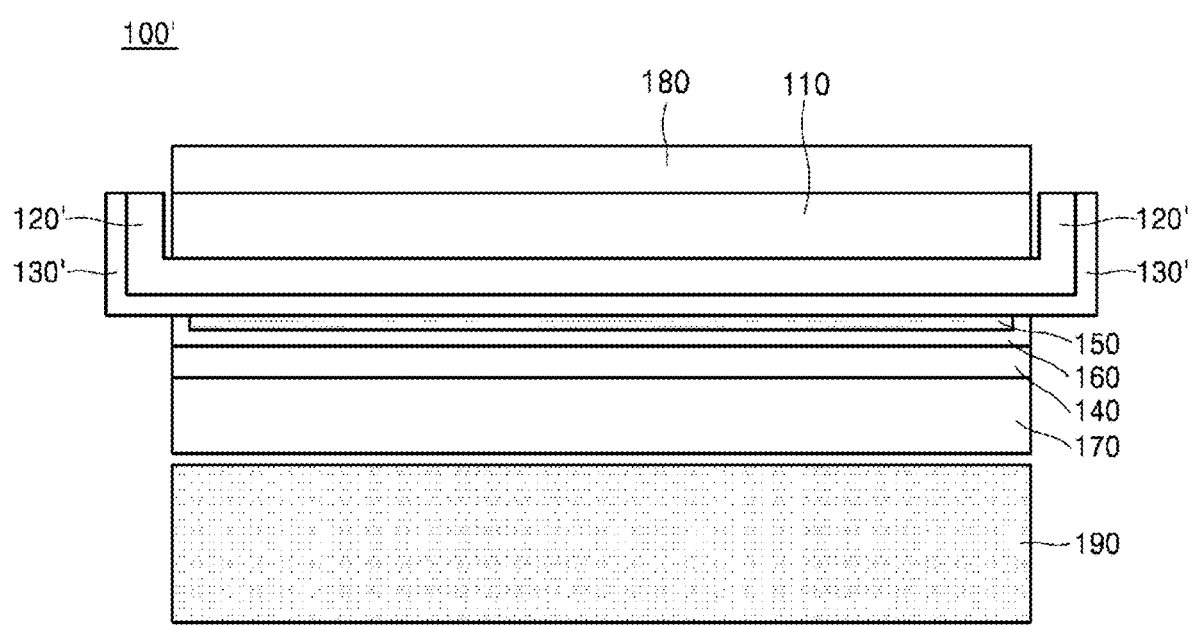
FIG. 8 is a cross-sectional view of a flexible display device according to another embodiment of the present disclosure.

FIG. 8 is a cross-sectional view of a flexible display device according to another embodiment of the present disclosure.

As illustrated in FIG. 8, in a flexible display device 100' according to an embodiment of the present disclosure, lateral side faces of the support substrate 110 may face away the inner side faces of a buffer substrate 120'. Except for this configuration, a remaining configuration of this example is substantially similar to that of the examples of FIGS. 1 to 4. Therefore, duplicate description may be omitted.

In the example illustrated in FIG. 8, a thin-film transistor array 130' may be on a first main face of the buffer substrate 120', while a support substrate 110' may be on an opposite main second face of the buffer substrate 120'. The lateral side faces of the support substrate 110 may face away the inner side faces of the buffer substrate 120'. For this configuration, the buffer substrate 120' may be partially (e.g., at side edges thereof) bent upward at an edge of the support substrate 110. In addition, a portion of the thin-film transistor arrays 130' on the buffer substrate 120 may be on the upwardly bending portion of the support substrate 110. As such, the non-display region may be extended to the side edge of the support substrate 110 so that the width of the bezel of the flexible display device 100' may be further reduced.

The following describes a method for producing a flexible display device according to an embodiment of the present disclosure.

Figure 9:
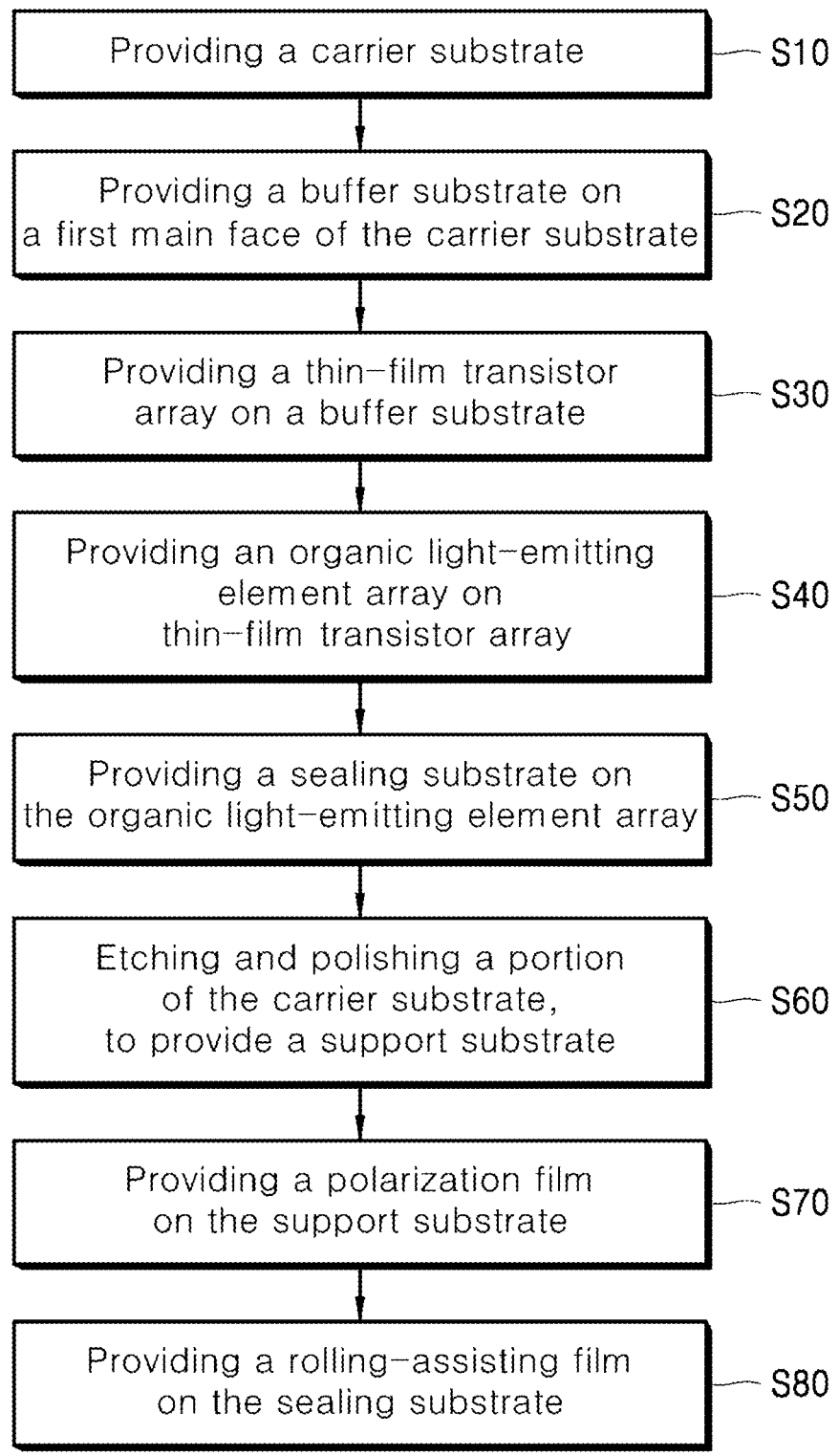
FIG. 9 shows a method of manufacturing a flexible display device according to an embodiment of the present disclosure.

FIG. 9 shows a method of manufacturing a flexible display device according to an embodiment of the present disclosure. FIGS. 10 to 16 show cross-sections of intermediate structures corresponding to operations of FIG. 9.

As illustrated in the FIG. 9 example, a method for manufacturing a flexible display device according to an embodiment of the present disclosure may include an operation S10 of providing a carrier substrate, an operation S20 of providing a buffer substrate on a first main face of the carrier substrate, an operation S30 of providing a thin-film transistor array on a buffer substrate, an operation S40 of providing an organic light-emitting element array on the thin-film transistor array, an operation S50 of providing a sealing substrate on the organic light-emitting element array, an operation S60 of etching and polishing a portion of the carrier substrate to provide a support substrate having a first thickness and contacting the buffer substrate, an operation S70 of providing a polarization film configured to polarize light emitted from the organic light-emitting element array on a main face of the support substrate opposite the buffer substrate, and an operation S80 of providing a rolling-assisting film promoting a formation of a rolled form on the sealing substrate.

Figure 10:
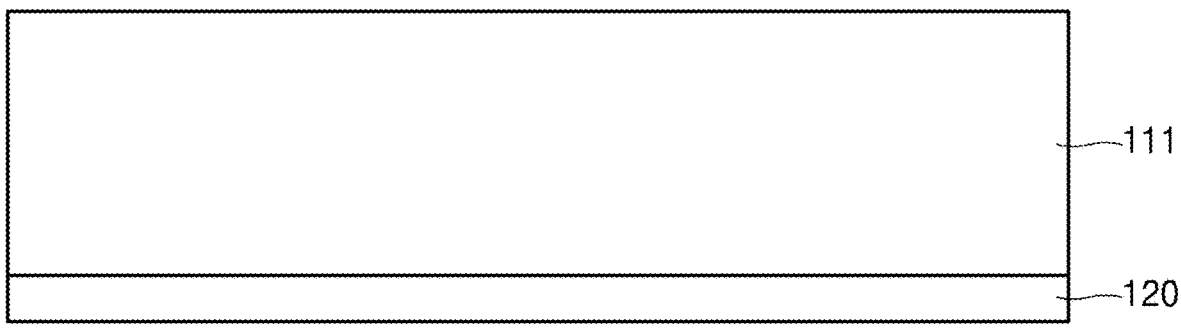
FIGS. 10 to 16 show cross-sections of intermediate structures corresponding to operations of FIG. 9.

As shown in the FIG. 10 example, a carrier substrate 111 including a first material may be provided (S10). Subsequently, a buffer substrate including a second material more flexible than the first material may be provided on the carrier substrate 111 (S20).

The first material may be a material that transmits light and has low reactivity to processes, such as etching and heat-treatment of semiconductor materials and metal materials. In addition, the first material may be a material having a softness at a thickness below a threshold, while having a rigidity at a thickness exceeding the threshold value such that deformation thereof may not occur due to a weight thereof. Further, the first material may be a material that may be subjected to an etching process and a polishing process, e.g., to reduce the thickness thereof. By way of example, the first material may be a glass, although embodiments are not limited thereto.

Further, a thickness of the carrier substrate 111 may be within a range configured to allow the substrate to have a rigidity to such an extent that shape deformation of the substrate may not occur due to its own weight, and to allow the substrate to have a weight that allows easy transportation thereof. By way of example, if the carrier substrate 111 includes glass, the thickness of the carrier substrate 111 may be in a range of about 400 μm to 700 μm, although embodiments are not limited thereto.

The buffer substrate 120 may include a second material that may be softer than the first material. By way of example, the second material may include one or more of: polyethylene terephthalate (PET), ethylene naphthalate (PEN), polyimide (PI), polymethyl methacrylate (PMMA), polycarbonate (PC), polystyrene, and/or polyethersulfone (PES). For example, the second material may be PI with relatively high availability.

The thickness of the buffer substrate 120 may be selected to reduce or prevent the buffer substrate 120 from being lifted up, and to suppress the transmittance degradation and the crack transmission through the buffer substrate 120. By way of example, if the second material is a PI, the thickness of the buffer substrate may be in a range of about 3 μm to 20 μm, inclusive, although embodiments are not limited thereto.

Figure 11:
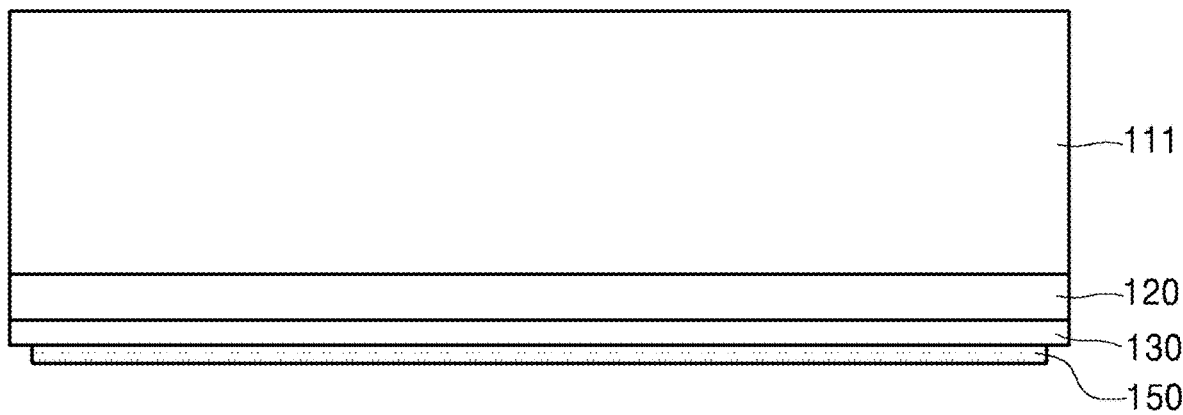

As illustrated in the example of FIG. 11, the thin-film transistor array 130 may be provided on the buffer substrate 120 (S30). Then, the organic light-emitting element array 150 may be provided on the thin-film transistor array 130 (S40).

With reference back to the example of FIG. 3, the thin-film transistor array 130 may define a plurality of pixel regions corresponding to a plurality of sub-pixels. The array 130 may include at least one thin-film transistor TFT corresponding to each of a plurality of pixel regions. Further, the organic light-emitting element array 130 may include a plurality of organic light-emitting element OLEDs (for example, as shown in FIG. 3) corresponding to a plurality of sub-pixels.

Figure 12:
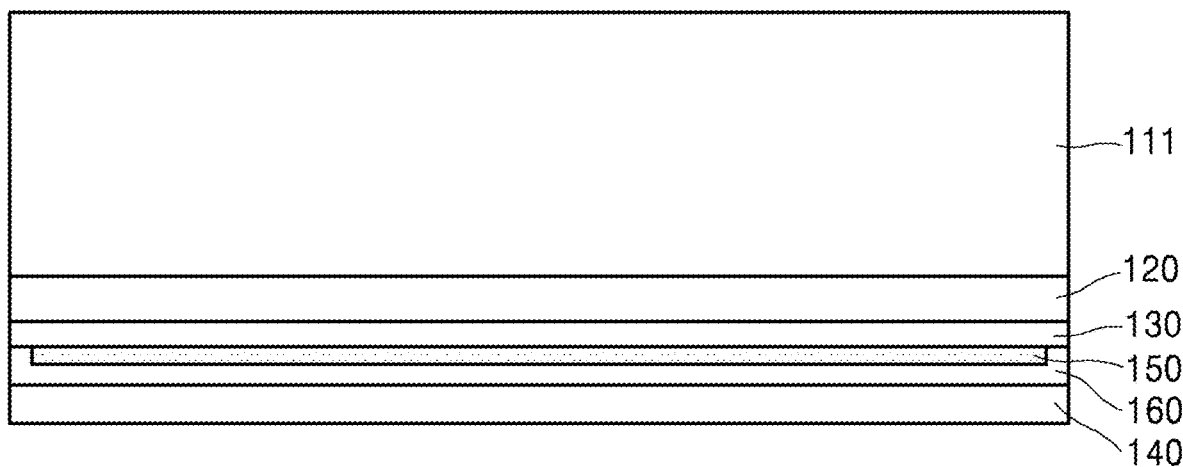

As illustrated in the FIG. 12 example, the sealing substrate 140 may be provided on the organic light-emitting element array 150 so that the sealing substrate 140 faces away from the buffer substrate 120 (S50). As shown in the example of FIG. 12, the sealing substrate 140 may be fixed on the organic light-emitting element array 150 by the adhesive film 160 between the thin-film transistor array 130 and the sealing substrate 140. That is, while the buffer substrate 120 and the sealing substrate 140 may form the outer portions of a sandwich, for example, with the thin-film transistor array 130 and the organic light-emitting element array 150 between the two substrates, the buffer substrate 120 and the sealing substrate 140 may be bonded to each other via the adhesive film 160.

Figure 13:
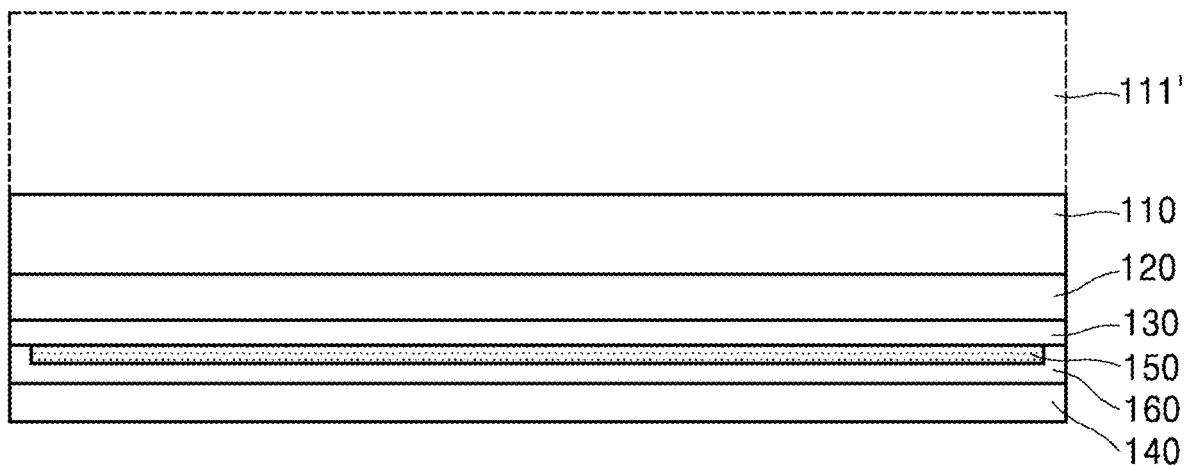

Further, as illustrated in the FIG. 13 example, a portion 111' of the carrier substrate may be etched and polished to provide the support substrate 110 of a first thickness (S60). As noted above, the buffer substrate 120 may be on a first main face of the carrier substrate 111. Thus, after providing the support substrate 110, the thin film transistor array 130 may be provided on a first main face of the buffer substrate 120, while the support substrate 110 may be provided on a second opposite main face of the buffer substrate 120.

The first material may be a material having a softness at a thickness below a threshold, while having a rigidity at a thickness exceeding the threshold value such that deformation thereof may not occur due to a weight thereof. Further, the first material may be a material that may be subjected to an etching process and a polishing process, e.g., to reduce the thickness thereof. By way of example, the first material may be a glass, although embodiments are not limited thereto.

Further, the first thickness of the support substrate 110 may be selected in consideration of a softness of the first material, a damage resulting from a particular physical impact thereto, and a rigidity to maintain a shape and posture. By way of example, the first thickness may be between about 50 μm and 100 μm, inclusive. For example, the first thickness may be about 80 Embodiments are not limited to these examples.

Figure 14:
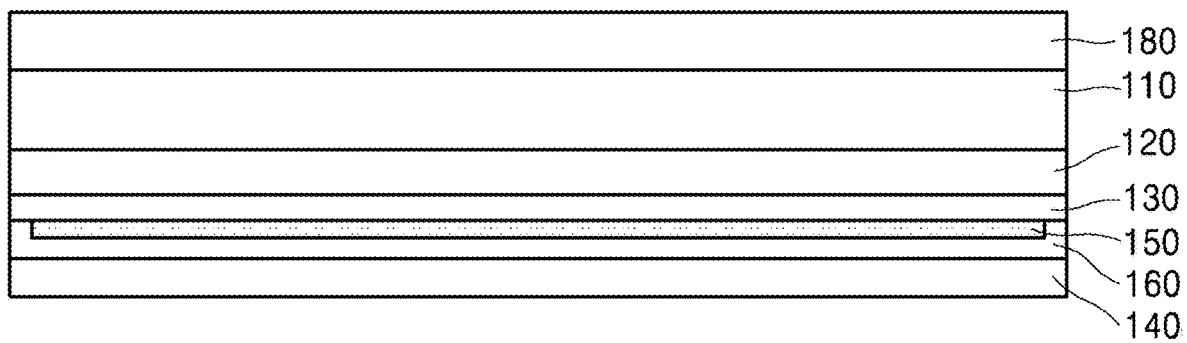

As illustrated in the example of FIG. 14, the polarization film 180 may be provided on an exposed main surface of the support substrate 110 (S70). The polarization film 180 may be configured to polarize light emitted from the organic light-emitting element array 150 and transmitted through the buffer substrate 120 and the support substrate 110. The polarization film 180 may suppress deterioration in image quality resulting from the external light. By way of example, the polarization film 180 may have a thickness in a range of about 170 μm to 650 μm, although embodiments are not limited thereto.

Figure 15:
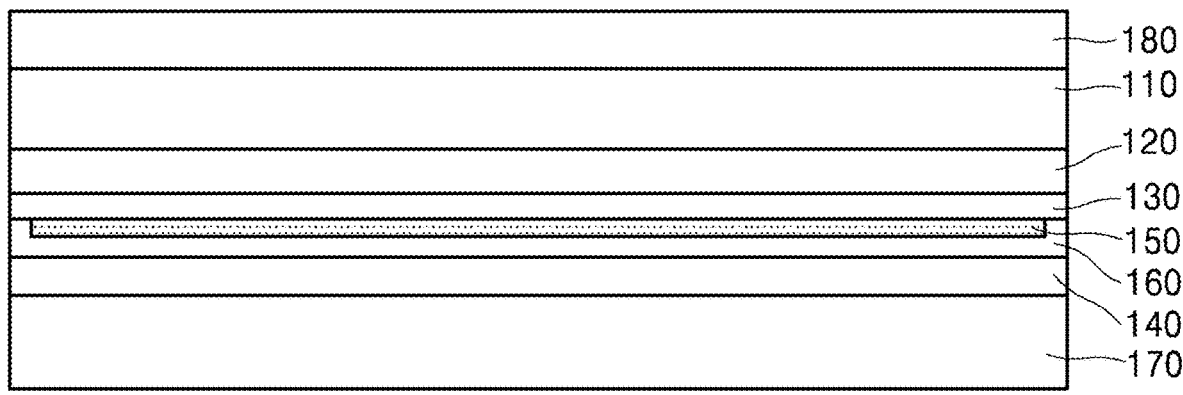

As illustrated in the FIG. 15 example, the rolling-assisting film 170 may be provided on an exposed main surface of the sealing substrate 140 (S80). The rolling-assisting film 170 may allow the flexible display device 100 to be formed into various degrees of a rolled form. By way of example, as illustrated in the FIG. 4 example, the rolling-assisting film 170 may include at least one base 171 and a pattern of a plurality of ribs 172 on the base 171 and spaced apart by a particular distance. The ribs pattern 172 may be sandwiched between a pair of bases 171.

Figure 16:
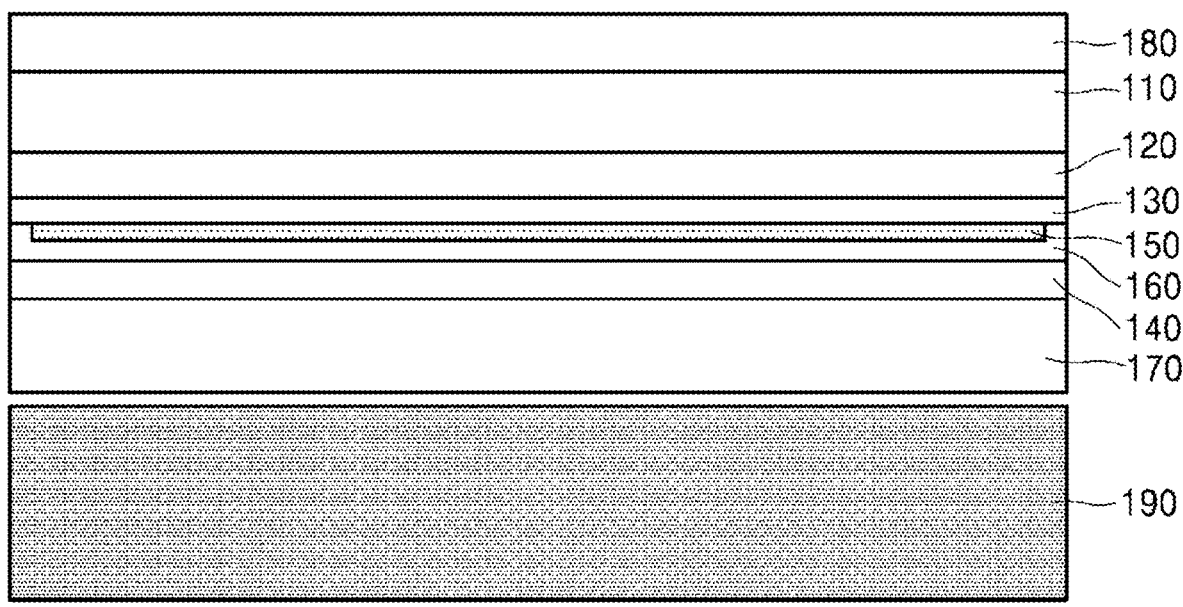

Further, as illustrated in the example of FIG. 16, when the flexible display device 100 maintains the extended flat form, a display module DM may be housed in the bottom cover 190 corresponding to the flat form. The display module DM may include the polarization film 180, the support substrate 110, the buffer substrate 120, the thin-film transistor array 130, the organic light-emitting element array 150, the adhesive film 160, the sealing substrate 140, and the rolling-assisting film 170.

In addition, although not separately illustrated in the drawings, a method of fabricating a flexible display device (e.g., 100' in FIG. 8) according to an embodiment of the present disclosure may further include, after the operation S70 in which the portion 111' of the carrier substrate may be etched and polished to provide the support substrate 110 of the first thickness, a further operation of removing an edge portion of the support substrate 110 to expose an edge region of the face of the buffer substrate 120 facing the support substrate 110, and a further operation of bending the buffer substrate 120 such that the exposed edge portion of the buffer substrate 120 may face an outer lateral face of the support substrate 110.

In this manner, the method for fabricating the flexible display device according to an embodiment of the present disclosure may not include a removal process of the carrier substrate 111 using a laser lift off (LLO) process. Therefore, damage of the buffer substrate 120 due to the laser lift off (LLO) process may be reduced or prevented. That is, the buffer substrate 120 may be suppressed or prevented from peeling away or being lifted up together with the carrier substrate 111, which may otherwise occur in a region in which the laser may not be uniformly irradiated, e.g., due to foreign matter or cracks in the surface of the carrier substrate 111. Thus, because the process defect of the flexible display device 100 may be reduced, the reliability and yield of the device may be improved.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A flexible display device, comprising:
   a support substrate having a first thickness and comprising a first material, the support substrate further comprising first and second main faces opposite to each other;
   a buffer substrate on the first main face of the support substrate, the buffer substrate having a second thickness smaller than the first thickness, and the buffer substrate comprising a second material more flexible than the first material;
   a thin-film transistor array on the buffer substrate, such that the buffer substrate is between the thin-film transistor array and the support substrate;
   a sealing substrate fixed above the thin-film transistor array, the thin-film transistor array being between the buffer substrate and the sealing substrate; and
   a rolling-assisting film on the sealing substrate,
   wherein the sealing substrate is between the rolling-assisting film and thin-film transistor array, and
   wherein the rolling-assisting film includes at least one base, and a plurality of rib patterns on one of the at least one base and spaced apart by a particular distance, and
   wherein an arrangement direction of the plurality of rib patterns corresponds to a rolling direction of the rolled form.

2. The device of claim 1, wherein:
   the first material comprises glass; and
   the first thickness is between 50 μm and 100 μm, inclusive.

3. The device of claim 2, wherein:
   the second material comprises one or more of: polyethylene terephthalate (PET), ethylene naphthalate (PEN), polyimide (PI), polymethyl methacrylate (PMMA), polycarbonate (PC), polystyrene, and polyethersulfone (PES); and
   the second thickness is in a range of 3 μm to 20 μm inclusive.

4. The device of claim 1, wherein, when the device has a rolled form, a radius of curvature of the device is between 40 mm and 3500 mm, inclusive.

5. The device of claim 1,
wherein the sealing substrate is between the rolling-assisting film
wherein the rolling-assisting film is configured to promote rolling of the flexible display device into a rolled form, and
wherein an arrangement direction of the plurality of rib pattern corresponds to a rolling direction of the rolled form.

6. The device of claim 1, further comprising:
an organic light-emitting element array between the thin-film transistor array and the sealing substrate,
wherein the organic light-emitting element array comprises a plurality of organic light-emitting elements respectively corresponding to a plurality of sub-pixels, and
wherein the organic light-emitting element array is sealed by the sealing substrate.

7. The device of claim 6, further comprising:
a polarization film on the second main face of the support substrate,
wherein the polarization film is configured to polarize light emitted from the organic light-emitting element array, and
wherein the polarization film has a thickness in a range of 170 μm to 650 μm, inclusive.

8. The device of claim 1, wherein the buffer substrate comprises an edge portion bent to face a lateral side face of the support substrate.

9. The device of claim 8, wherein the thin-film transistor array comprises an edge portion that is bent to cover the bent edge portion of the buffer substrate, the bent edge portion of the buffer substrate being between the lateral side face of the support substrate and the edge portion of the thin-film transistor array.

* * * * *